US009904329B2

(12) United States Patent
Sisler

(10) Patent No.: US 9,904,329 B2
(45) Date of Patent: Feb. 27, 2018

(54) POWER SUPPLY AND CIRCUIT MODULE FOR DATA PROCESSING SYSTEM

(71) Applicant: VIOLIN SYSTEMS LLC, San Jose, CA (US)

(72) Inventor: John Robert Sisler, Scotts Valley, CA (US)

(73) Assignee: VIOLIN SYSTEMS LLC, San Jose, CA (US)

( * ) Notice: Subject to any disclaimer, the term of this patent is extended or adjusted under 35 U.S.C. 154(b) by 0 days.

(21) Appl. No.: 13/930,671

(22) Filed: Jun. 28, 2013

(65) Prior Publication Data

US 2014/0003001 A1 Jan. 2, 2014

Related U.S. Application Data

(60) Provisional application No. 61/666,526, filed on Jun. 29, 2012.

(51) Int. Cl.
*G06F 1/18* (2006.01)
*H05K 7/14* (2006.01)
*G06F 1/20* (2006.01)

(52) U.S. Cl.
CPC ............. *G06F 1/183* (2013.01); *G06F 1/181* (2013.01); *G06F 1/188* (2013.01); *G06F 1/20* (2013.01); *H05K 7/1492* (2013.01)

(58) Field of Classification Search
CPC .......... G06F 1/181; G06F 1/183; G06F 1/188; H05K 7/1492
See application file for complete search history.

(56) References Cited

U.S. PATENT DOCUMENTS

| | | | | |
|---|---|---|---|---|
| 4,977,532 A | * | 12/1990 | Borkowicz et al. | 361/741 |
| 5,101,320 A | | 3/1992 | Bhargava et al. | |
| 5,680,294 A | | 10/1997 | Stora et al. | |
| 6,025,989 A | * | 2/2000 | Ayd et al. | 361/695 |
| 6,285,546 B1 | * | 9/2001 | Watarai et al. | 361/695 |
| 6,442,031 B1 | * | 8/2002 | Liu | 361/727 |
| 6,525,926 B1 | * | 2/2003 | Chen | 361/679.6 |
| 6,867,966 B2 | * | 3/2005 | Smith et al. | 361/679.48 |
| 6,952,349 B2 | * | 10/2005 | Gough et al. | 361/741 |
| 6,988,626 B2 | * | 1/2006 | Varghese et al. | 211/26 |
| 7,193,847 B2 | * | 3/2007 | Liang et al. | 361/679.48 |
| 7,200,004 B2 | | 4/2007 | Chen et al. | |
| 7,339,785 B2 | * | 3/2008 | Colborn et al. | 361/679.33 |

(Continued)

OTHER PUBLICATIONS

Supplementary European Search Report from corresponding European Patent Application No. 13809551.8 dated Nov. 16, 2015, 9 pgs.

(Continued)

*Primary Examiner* — Adrian S Wilson
(74) *Attorney, Agent, or Firm* — Brinks Gilson & Lione

(57) ABSTRACT

A power supply and circuit module includes a housing, a power supply and a circuit module received in the housing. The power supply and the circuit module can be removably installed into and removed from a cage of an electronic system as a unit by a sliding action. The cage includes a first bottom plate, a backplane connected to the first bottom plate. A plurality of standoffs are formed on the first bottom plate for supporting a motherboard thereon. An electrical connector, such as a card connector, is directly formed on the backplane for connecting a circuit card.

7 Claims, 13 Drawing Sheets

(56) References Cited

U.S. PATENT DOCUMENTS

| | | | |
|---|---|---|---|
| 7,397,670 B2* | 7/2008 | Su | 361/752 |
| 7,495,906 B2* | 2/2009 | Fujie et al. | 361/679.49 |
| 7,535,717 B2* | 5/2009 | Lai et al. | 361/727 |
| 7,542,300 B1* | 6/2009 | Lui et al. | 361/755 |
| 7,791,865 B2* | 9/2010 | Wirtzberger et al. | 361/679.01 |
| 8,144,458 B2* | 3/2012 | Vinson et al. | 361/679.46 |
| 8,164,900 B2* | 4/2012 | Sun et al. | 361/695 |
| 8,395,046 B2* | 3/2013 | Nicewicz et al. | 174/50 |
| 8,649,180 B2* | 2/2014 | Grady et al. | 361/725 |
| 8,727,456 B1* | 5/2014 | Bullock et al. | 312/223.2 |
| 2003/0043550 A1* | 3/2003 | Ives | 361/726 |
| 2003/0193781 A1* | 10/2003 | Mori | 361/725 |
| 2004/0062002 A1* | 4/2004 | Barringer et al. | 361/687 |
| 2004/0222647 A1 | 11/2004 | Smith et al. | |
| 2006/0250777 A1 | 11/2006 | Chen et al. | |
| 2007/0230111 A1* | 10/2007 | Starr et al. | 361/685 |
| 2008/0266817 A1 | 10/2008 | Li | |
| 2010/0265645 A1* | 10/2010 | Wang et al. | 361/679.4 |
| 2011/0182022 A1* | 7/2011 | Lu et al. | 361/679.33 |
| 2011/0194245 A1 | 8/2011 | Wu et al. | |
| 2011/0261526 A1* | 10/2011 | Atkins et al. | 361/679.33 |
| 2011/0267782 A1* | 11/2011 | Petrick et al. | 361/724 |
| 2013/0016456 A1* | 1/2013 | Lindholm et al. | 361/679.01 |

OTHER PUBLICATIONS

International Preliminary Report on Patentability from corresponding International Application No. PCT/US2013/048476 dated Dec. 31, 2014, 7 pgs.

* cited by examiner

POWER SUPPLY AND CIRCUIT MODULE FOR DATA PROCESSING SYSTEM

CROSS-REFERENCE TO RELATED APPLICATION

The present application claims the benefit of U.S. Provisional Application No. 61/666,526, titled "Power Supply and Circuit Module for Data Processing Systems," and filed on Jun. 29, 2012, the content of which is incorporated herein by reference in its entirety.

FIELD

The present disclosure relates to power supplies and power circuits for data processing systems, and more particularly to structures for installing the power supplies and power circuits in cages for data processing systems.

BACKGROUND

The statements in this section merely provide background information related to the present disclosure and may not constitute prior art.

Data processing systems generally include back-up power supplies. When an AC power is lost, the back-up power supply enables various electronic components in the data processing system to continue operation, for example, to finish memory operations without any loss of read-write transactions. The power supply is connected to the various electronic components, such as memory cards, processors, etc. through power circuits. The power circuits are typically provided on a motherboard disposed in a cage to control power delivered to the various electronic components. When a failure on the power circuits is detected, the cage needs to be opened in order to remove the motherboard from the cage for service. In a top-loading cage, a top cover needs to be removed before the motherboard can be removed.

A cage typically includes a bottom plate having a plurality of standoffs extending vertically from the bottom plate. When a motherboard is mounted on the bottom plate, a space is formed between the motherboard and the bottom plate due to the presence of the standoffs. The space is needed to accommodate portions of electronic components that may protrude through the motherboard or be mounted to the lower surface of the motherboard. The standoffs, however, occupy useful vertical space above the motherboard, thereby preventing circuit cards of a larger size from being installed to the motherboard in a vertical orientation. When circuit cards of a larger size are installed in a horizontal orientation with the card surfaces being parallel to the motherboard, the overall packaging capacity of the cage is undesirably limited.

SUMMARY

An electronic system according to the present disclosure includes a cage and a removable assembly having a power supply and a circuit module. The removable assembly can be installed into and removed from the cage by a sliding action without opening the cage. This action can be performed on the power supply and circuit module together, or the power supply alone, while leaving the circuit module installed. The removable assembly includes a housing slidably inserted into an opening of the cage. The removably assembly is received in the housing.

In one aspect of the present disclosure, an electronic system includes a removable assembly and a cage. The removable assembly includes a power supply, a circuit module, and a housing. The circuit module is mounted to the housing and the power supply is slidably insertable into the housing so as to mate electrically with the circuit module. The cage contains electronic circuits and is adapted to slidably receive the removable assembly so as to mate electrically with the circuit module. The power supply is removable from the housing without removing the removable assembly from the cage.

In another aspect of the present disclosure, a removable assembly includes an elongated housing defining a front end and a rear end. A connector is disposed on the front end so as to mate with a corresponding connector on the cage. The rear end of the housing has an aperture to accept the power supply. A circuit module is attached to the elongated housing adjacent to the front end. The power supply is removably connected to the circuit module by a plug-in action and mating connectors.

In still another aspect of the present disclosure, a cage for an electronic system includes a first bottom plate, a backplane connected to the first bottom plate, a plurality of standoffs extending vertically from the first bottom plate, and an electrical connector formed on the backplane. The cage further includes a motherboard disposed on the first bottom plate and the plurality of standoffs. The electrical connector may be a card connector for connecting a circuit card.

DRAWINGS

The drawings described herein are for illustration purposes only and are not intended to limit the scope of the present disclosure in any way.

DETAILED DESCRIPTION

Figure 1:
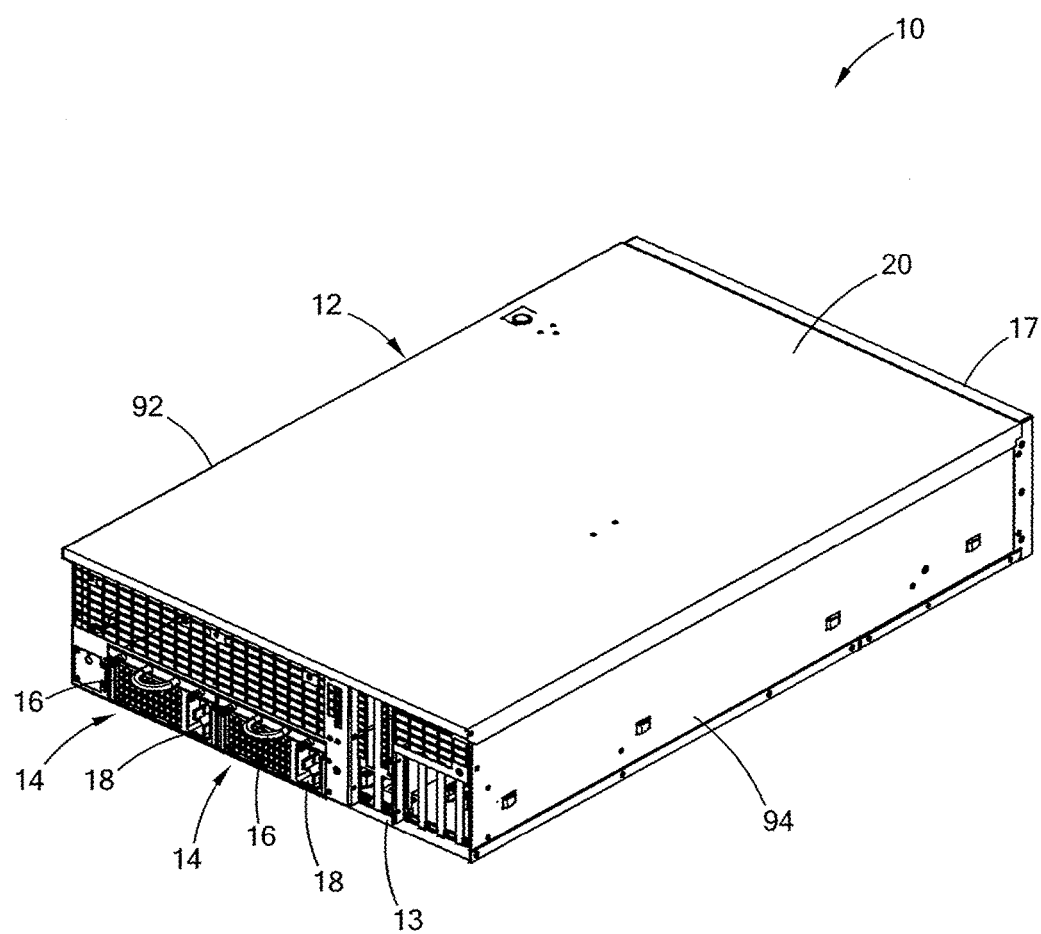
FIG. 1 is a perspective view of an electronic system including a pair of removable assemblies constructed in accordance with the teachings of the present disclosure.

The following description is merely exemplary in nature and is not intended to limit the present disclosure, application, or uses. It should be understood that throughout the drawings, corresponding reference numerals indicate like or corresponding parts and features.

Referring to FIG. 1, an electronic system 10, which may be a data processing system, includes a cage 12 and a pair of removable assemblies 14 removably installed in the cage 12. The cage 12 may include a top cover 20, a rear wall 13, a front wall 17, a first side wall 92, a second side wall 94, and a bottom portion 90 (shown in FIG. 8). FIG. 1 is a perspective view of the system viewed from a rear end thereof and thus the rear wall 13 is shown to be closer to the viewer. The removable assemblies 14 may be positioned side by side in the cage 12 and each includes a handle 16 to facilitate insertion and removal of the removable assemblies 14 into and from the cage 12 in a sliding action. The removable assemblies 14 may be inserted into/from the cage 12 at the rear end of the data processing system in a horizontal direction (parallel to the top cover 20), particularly through the rear wall 13 of the cage 12. The data processing system 10 may be a hot-swap data processing system where all active components, such as processors, various cards, power supplies and the like, are provided in pairs and are replaceable during normal operation of the data processing system 10. Therefore, a pair of removable assemblies 14 may be provided. One of the removable assemblies 14 can be replaced during normal operation of the data processing system 10 without interruption of the normal operation. An AC power socket 18 is provided at each removable assembly 14 for connecting to an external AC source. Other power sources, including a DC power source may be used. The cage 12 may be a top-loading enclosure, which is closed by the top cover 20. When service of components in the cage 12 is needed, the top cover 20 is removed to access the inside of the cage 12.

Figure 2:
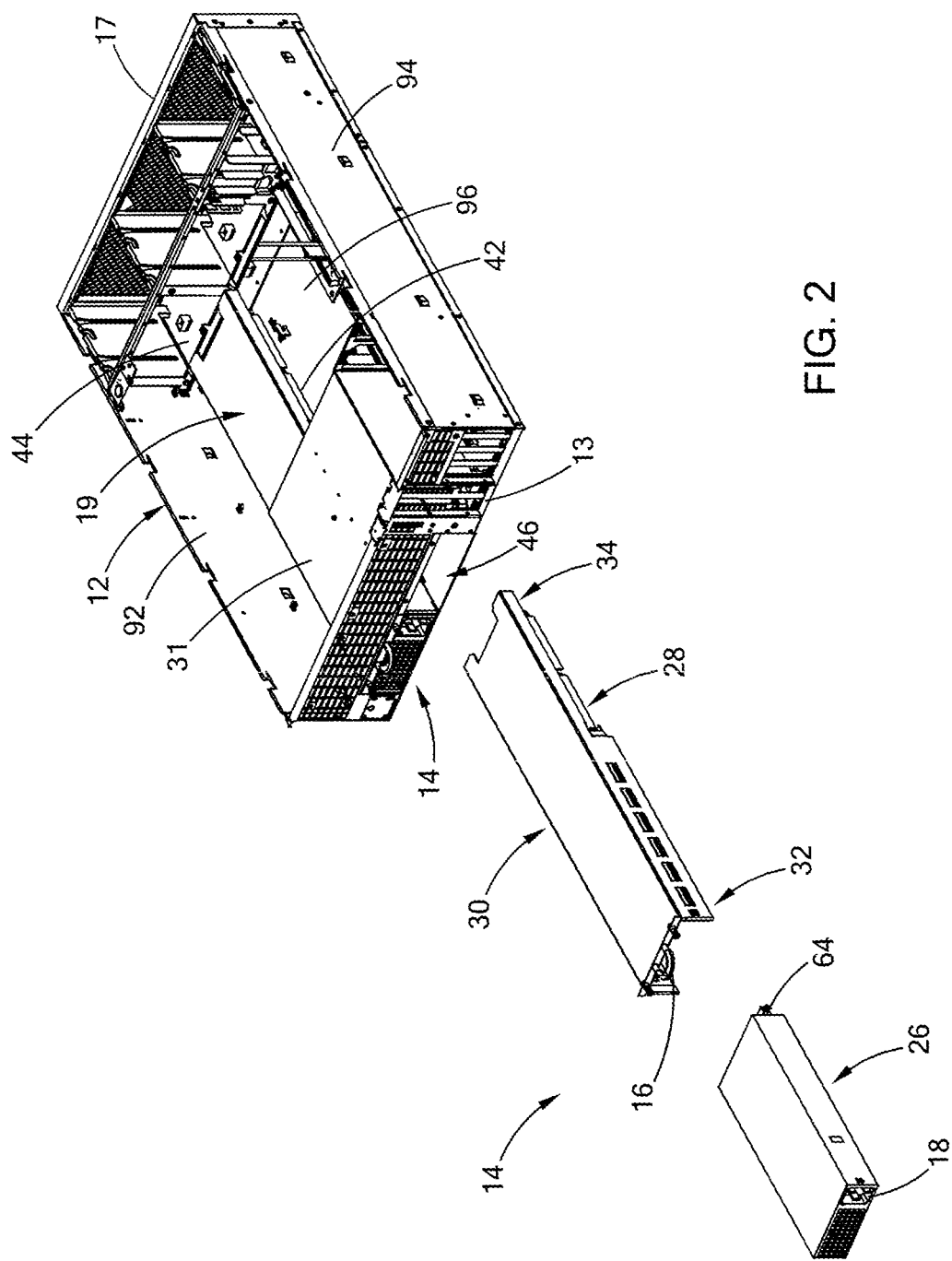
FIG. 2 is a partial exploded view of an electronic system, showing one of removable assemblies removed from a cage.

Referring to FIG. 2, the top cover 20 of the cage 12 is removed to show the inside of the cage 12. One removable assembly 14 is shown as removed from the cage 12. The removable assembly 14 includes a power supply 26, a circuit module 28, and a housing 30 that receives the power supply 26 and the circuit module 28. The housing 30 may have an elongated shape and have a substantially U-shaped structure cross section including a rear end 32 and a front end 34. The power supply 26 and the circuit module 28 are provided adjacent to the rear end 32 and the front end 34 of the housing 30, respectively, in this example. Therefore, when the removable assembly 14 is inserted in the cage 12, the power supply 26 is exposed to outside. A handle 16 is provided at the rear end 32 of housing 30.

The removable assemblies 14 are slidable on a first or main bottom plate 96 of the cage 12, and may be guided by other structures of the cage 12. The removable assemblies 14 each can be inserted into the cage 12 as a unit through an opening 46 of the rear wall 13. It is understood that the opening 46 can be provided at any of the four side walls 13, 17, 92, 94 of the cage 12 without departing from the scope of the present disclosure. A partition wall 42 may be disposed in the cage 12 to divide a receiving space for the pair of the removable assemblies 14. A motherboard 44 is disposed in the cage 12 adjacent to the front ends 34 of the removable assemblies 14. When the removable assemblies 14 are inserted into the receiving space of the cage 12, the connectors 62 of the circuit modules 28 at the front ends 34 of the housings 30 engage corresponding connectors (not shown) on the motherboard 44. Therefore, the removable assemblies 14 are electrically connected to the electric circuits and various components on the motherboard 44.

A second cover 31 may be provided inside the cage 12 and adjacent to the power supply 26. The second cover 31 may be disposed between the top cover 20 and the removable assemblies 14 to separate the removable assemblies 14 from the other electronic components in the cage 12. The second cover 31 also functions as a heat spreader (heat sink) to dissipate heat from and spread the heat away from the power supply 26.

Figure 3:
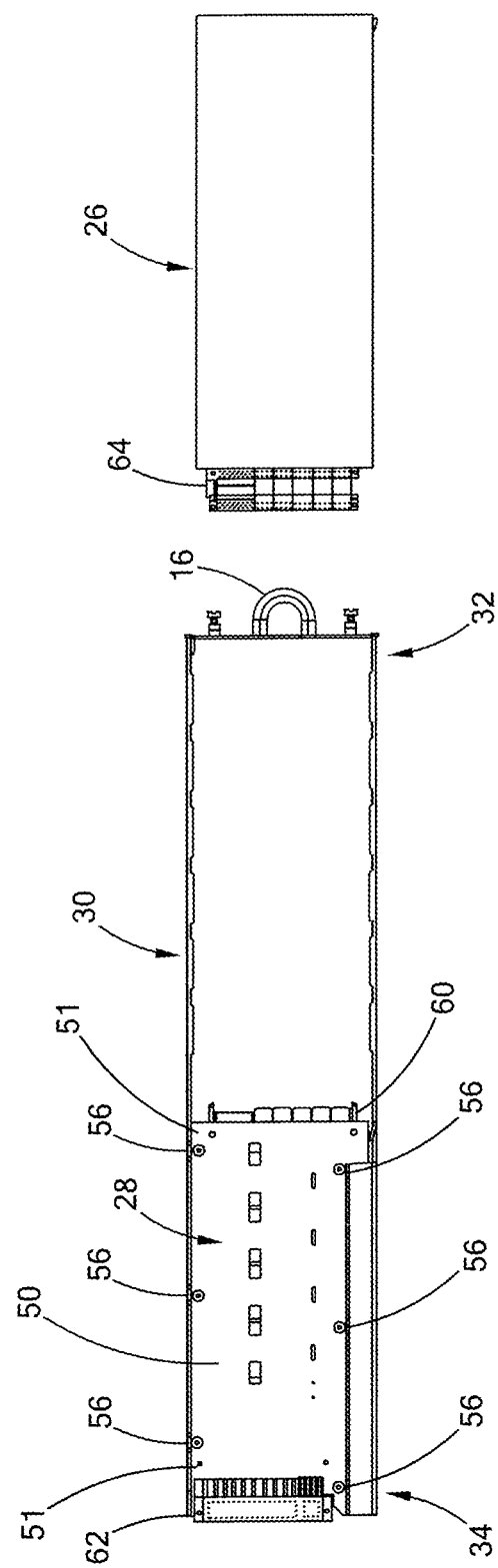
FIG. 3 is a bottom view of removable assembly including a power supply and a circuit module constructed in accordance with the teachings of the present disclosure, wherein the power supply is removed from a housing of the removable assembly.
Figure 4:
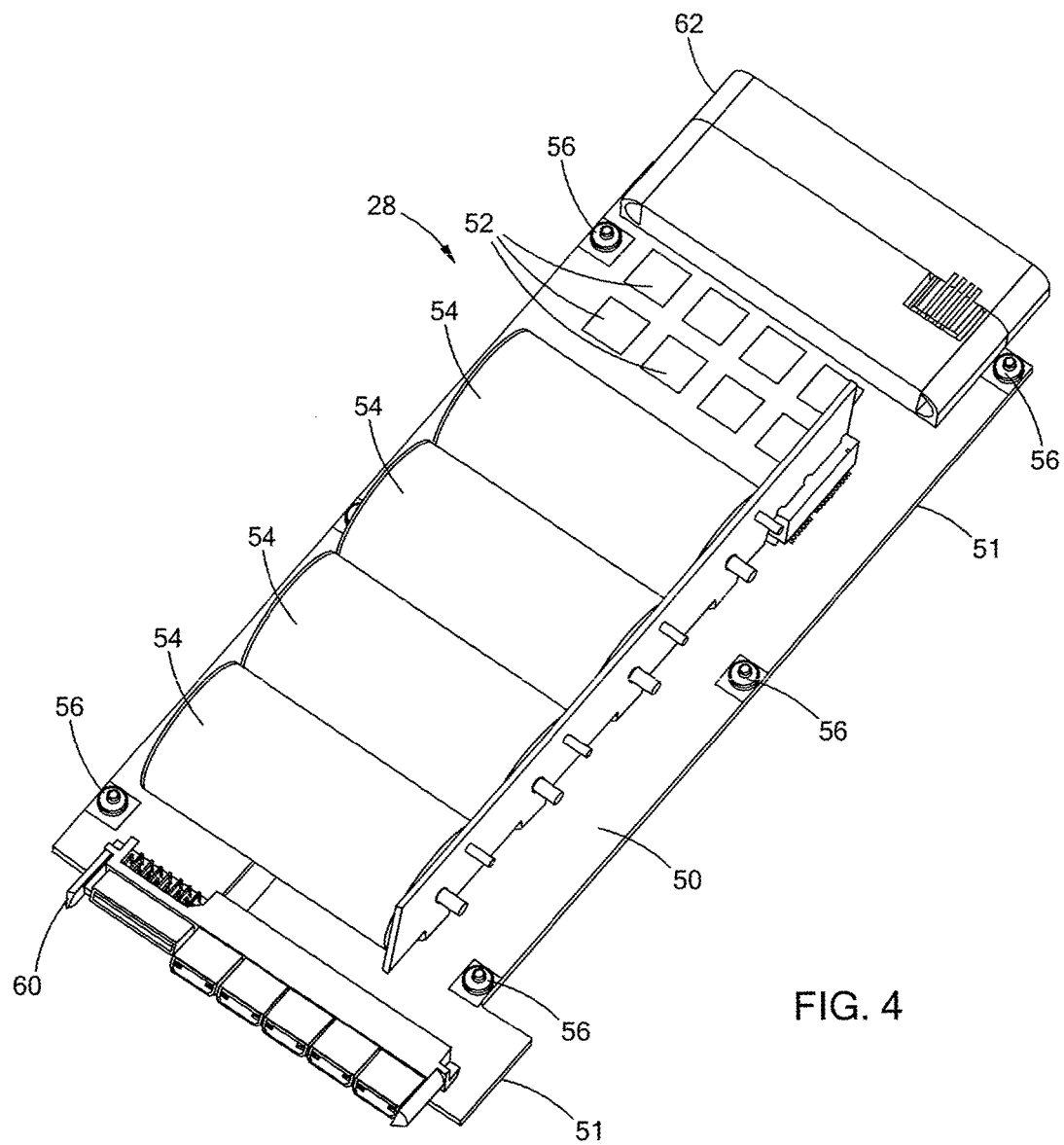
FIG. 4 is a perspective view of a circuit module of a removable assembly constructed in accordance with the teachings of the present disclosure.

Referring to FIGS. 3 and 4, the circuit module 28 includes a printed circuit board 50 or backplane having opposing ends 51. A plurality of power circuits 52 and electronic components such as capacitors 54 are disposed on the printed circuit board 50. The printed circuit board 50 includes holes (not shown) to allow screws 56 to pass through to connect the printed circuit board 50 to the housing 30. The circuit module 28 includes a rear connector 60 and a front connector 62 protruding from the opposing ends 51 of the printed circuit board 50. The rear and front connectors 60 and 62 engage a corresponding connector 64 of the power supply 26 and a corresponding connector (not shown) on the motherboard 44, respectively, to establish electrical connection among the power supply 26, the circuit module 28, and the electrical circuits on the motherboard 44.

Figure 5:
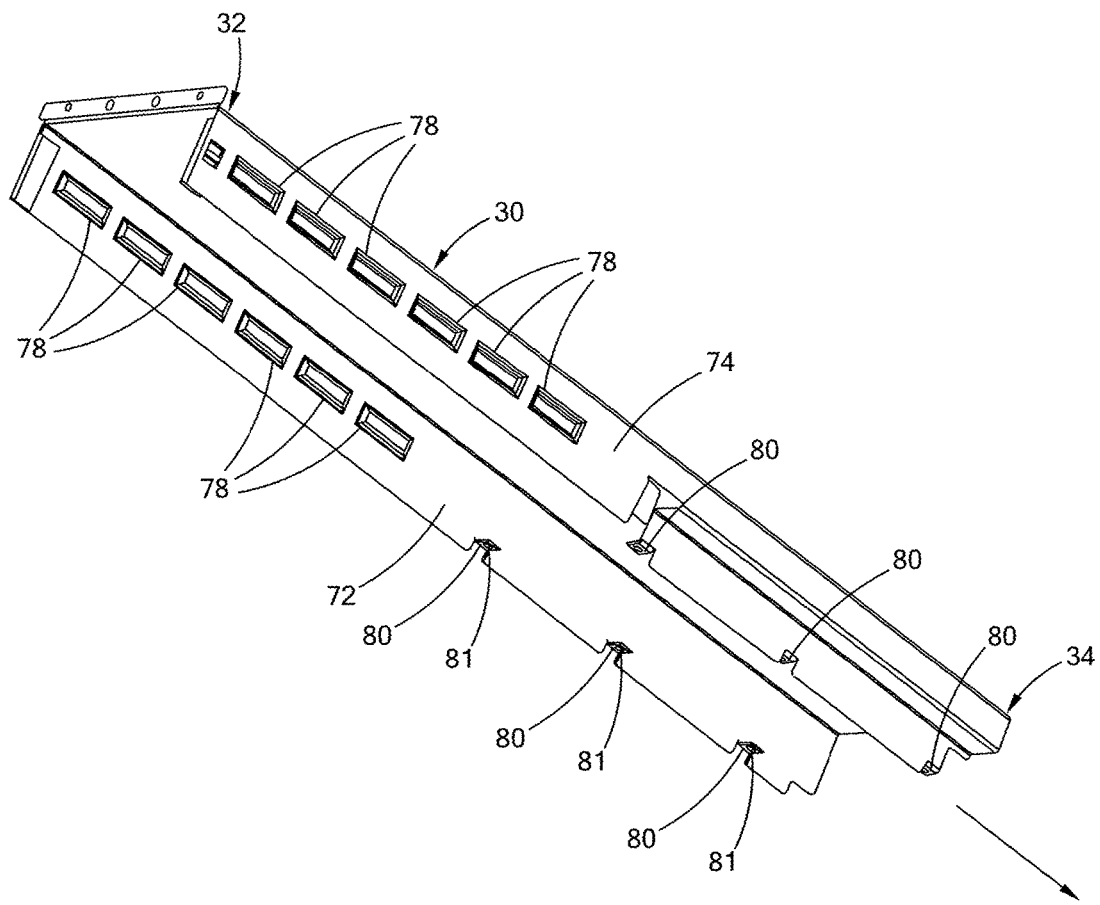
FIG. 5 is a perspective view of a housing of a removable assembly constructed in accordance with the teachings of the present disclosure.

Referring to FIG. 5, the housing 30 includes a top wall 70, a first side wall 72 and a second side wall 74 extending downwardly from the top wall 70 to form a substantially U-shape configuration. A plurality of protrusions 78 from inner surfaces of the first and second side walls 72 and 74 extend toward a center line of the housing 30 and disposed adjacent to the rear end 32 of the housing 30. The distance between the opposing protrusions 78 on the first and second side walls 72 and 74 may be substantially equal to or slightly smaller than the width of the power supply 26, so as to locate or captivate the inserted power supply 26. When the power supply 26 is inserted into the housing 30, the power supply 26 may be secured between the opposing protrusions 78 on the first and second side walls 72 and 74. In addition, an air flow channel (not shown) may be formed between the power supply 26 and the inner surfaces of the first and second side walls 72 and 74 of the housing 30 to facilitate air flow and cooling of the power supply 26. The protrusions 78 may help position the power supply 26 in the housing 30 before the power supply 26 is connected to the circuit module 28 by a plug-in action. The power supply 26 is removably attached to the circuit module 28 by mating connectors 60, 64.

Figure 6:
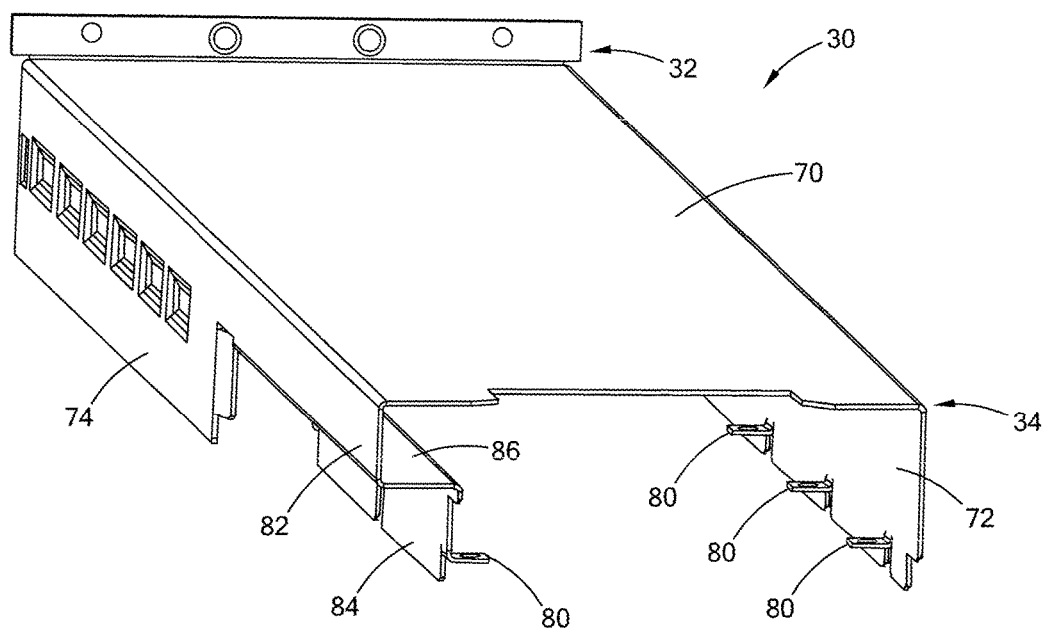
FIG. 6 is another perspective view of the housing of FIG. 5.

As shown in FIGS. 5 and 6, the first and second side walls 72 and 74 each include a plurality of tabs 80 for contacting and supporting the printed circuit board 50 thereon. The plurality of tabs 80 may extend horizontally and be parallel to the printed circuit board 50. The printed circuit board 50 is mounted to and fixed to the tabs 80 of the housing 30 by inserting the screws 56 (shown in FIGS. 3 and 4) through the holes of the printed circuit board 50 and the holes 81 in the tabs 80 of the housing 30. The circuits 52 and electronic components (e.g., 54) are disposed between the printed circuit board 50 and the top wall 70 of the housing 30.

Referring to FIG. 6, the second side wall 74 includes a first vertical portion 82, a second vertical portion 84, and a horizontal portion 86 therebetween, which are disposed adjacent to the front end 34. The second vertical portion 84 is spaced from the first vertical portion 82 along a horizontal direction parallel to the printed circuit board 50 and located closer to the center line of the housing 30. The horizontal portion 86 and the second vertical portion 84 define a bent portion that can be configured and adjusted to fit the size of the printed circuit board 50. An air flow channel (not shown) may be formed between the first vertical portion 84 of the second side wall 74 and the circuit module 28 to facilitate air flow and cooling of the circuit module 28.

Figure 7:
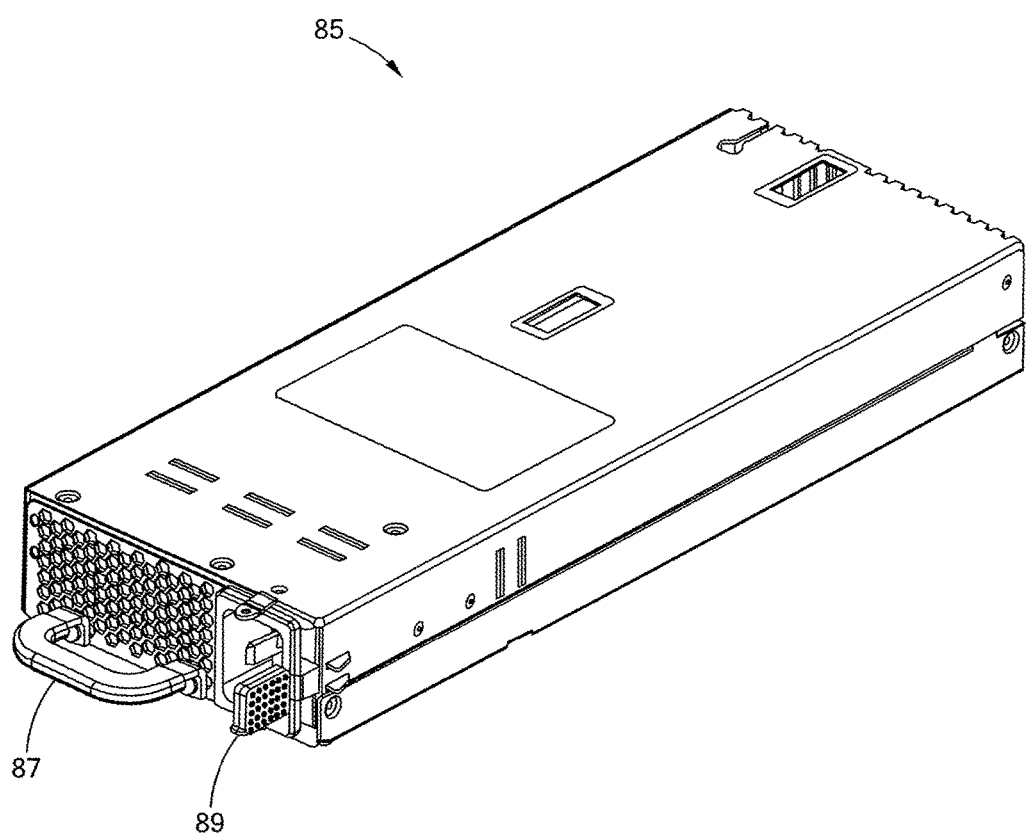
FIG. 7 is a perspective view of the removable assembly according to another embodiment of the present disclosure.

Referring to FIG. 7, a power supply 85 constructed in accordance with another aspect has a structure similar to the power supply 26 shown in FIGS. 2 and 3 except that the power supply 85 includes a handle 87 and a latch 89. By providing the handle 87 at the power supply 85, the power supply 85 can be installed into and removed from the cage 12 without removing the housing 30 and/or the circuit module 28 from the cage 12. The power supply 85 of FIG. 7 can be used with the circuit module 28 of FIG. 2 to form a similar removable assembly, which can be inserted into the cage 12 as a unit through the opening 46 of the rear wall 13. Similar to the power supply 26 (shown in FIG. 2), the power supply 85 of FIG. 7 includes a connector 64 for connecting to the connector 60 of the circuit module 28. As such, the power supply 85 can be individually inserted into or removed from the housing 30 or the cage 12 via a plug-in/ plug-out action by engaging/disengaging the connector 64 of the power supply 85 to/from the connector 60 of the circuit module 28 (see FIG. 3). Therefore, the power supply 85 can be individually removed from the cage 12 by using the handle 87 at the power supply 85 or removed together with the circuit module 28 and the housing 30 by using the handle 16 at the housing 30.

A latch 89 may be optionally provided to lock the power supply 85 in position when inserted. The latch 89 is shown in FIG. 7 in an unlock position. The latch 89 can be operated to engage the body of the cage 12 to lock the power supply 28 and the housing 30 in the cage 12, particularly to the rear wall 13 (shown in FIG. 1) of the cage 12.

Figure 8:
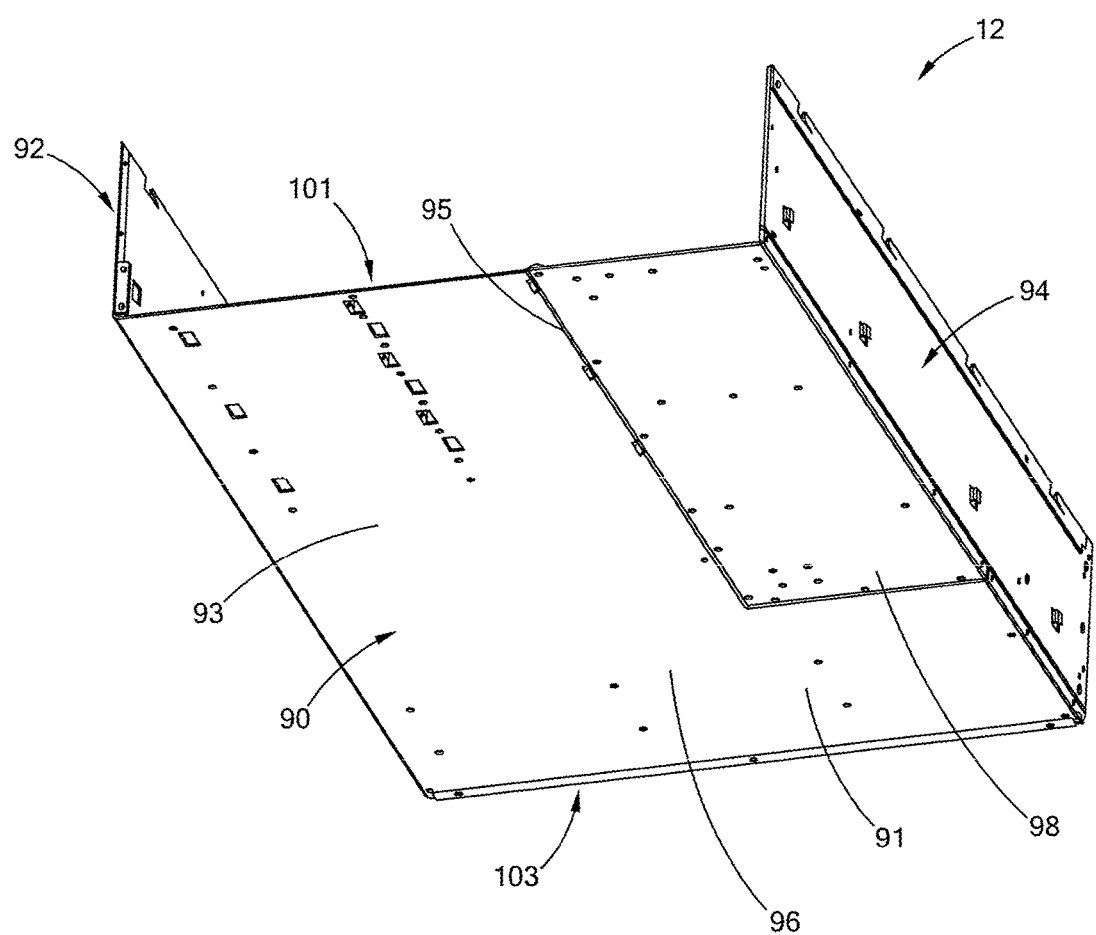
FIG. 8 is a bottom perspective view of a cage, wherein front and rear walls and a top cover are removed for clarity.

Referring to FIG. 8, the cage 12 defines a top-loading enclosure including a top cover 20 (shown in FIG. 1), a bottom portion 90, a first side wall 92, a second side wall 94, and rear and front walls 13 and 17 (shown in FIG. 1) connected to the first and second side walls 92 and 94. The bottom portion 90 includes a first or main bottom plate 96 and a second or auxiliary bottom plate 98 connected to the main bottom plate 98. In the exemplary embodiment of FIG. 8, the main bottom plate 96 defines a substantially L shape and has an L-shape edge 95. The auxiliary bottom plate 98 is connected to the main bottom plate 96 along the L-shape edge 95. It is understood that that the main bottom plate 96 may have a shape different from that shown in the drawings as long as the bottom portion 90 is formed by at least two pieces of plate components, which will become clear in the description below.

The main bottom plate 96 has a front portion 91 and a rear portion 93. The pair of removable assemblies 14 are disposed on the rear portion 93 when installed to the cage 12. The motherboard 44 is provided on the front portion 91 of the main bottom plate 96.

Figure 9:
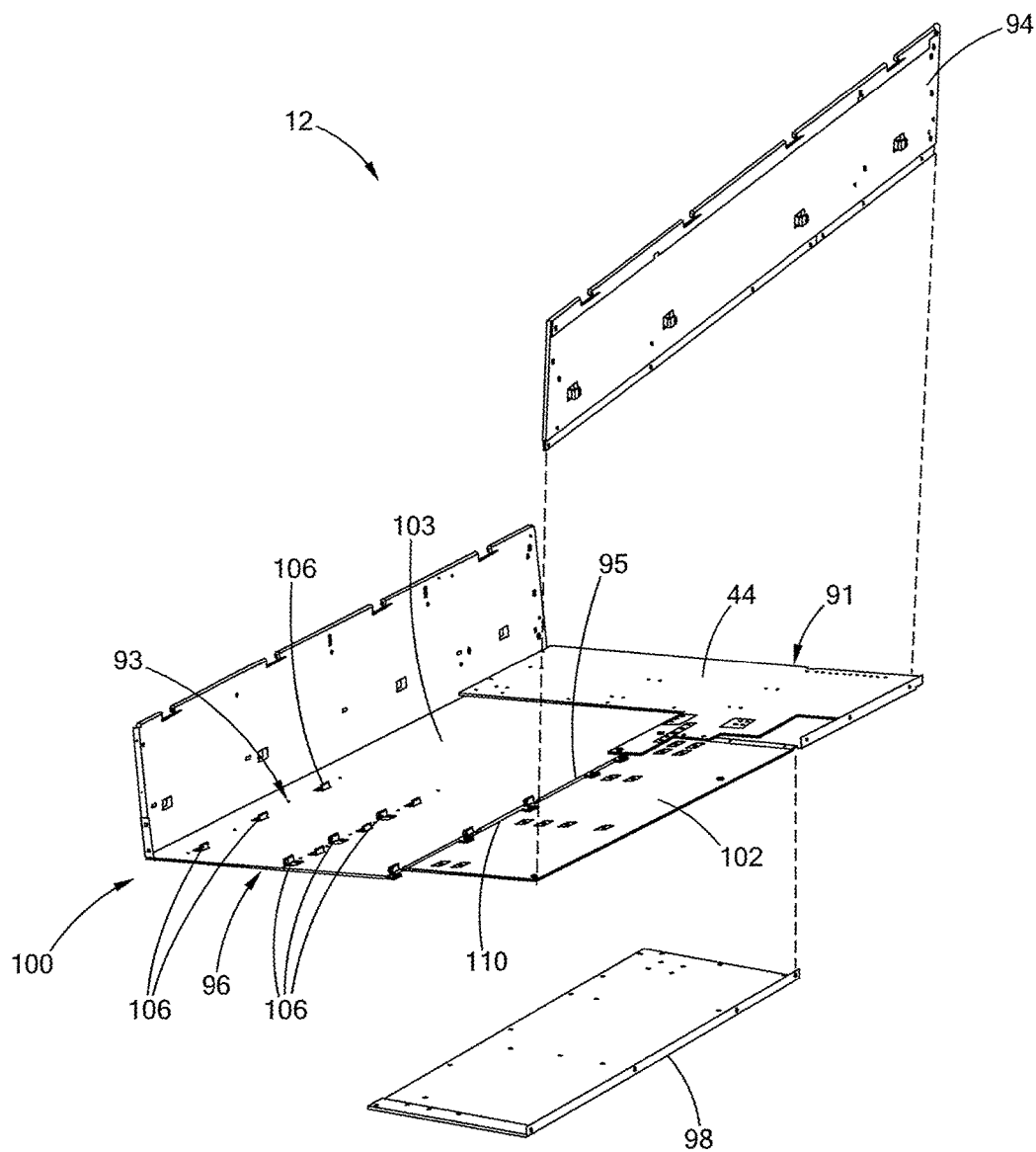
FIG. 9 is a partial exploded view of the cage in FIG. 8, showing a motherboard and a backplane mounted to the cage.
Figure 10:
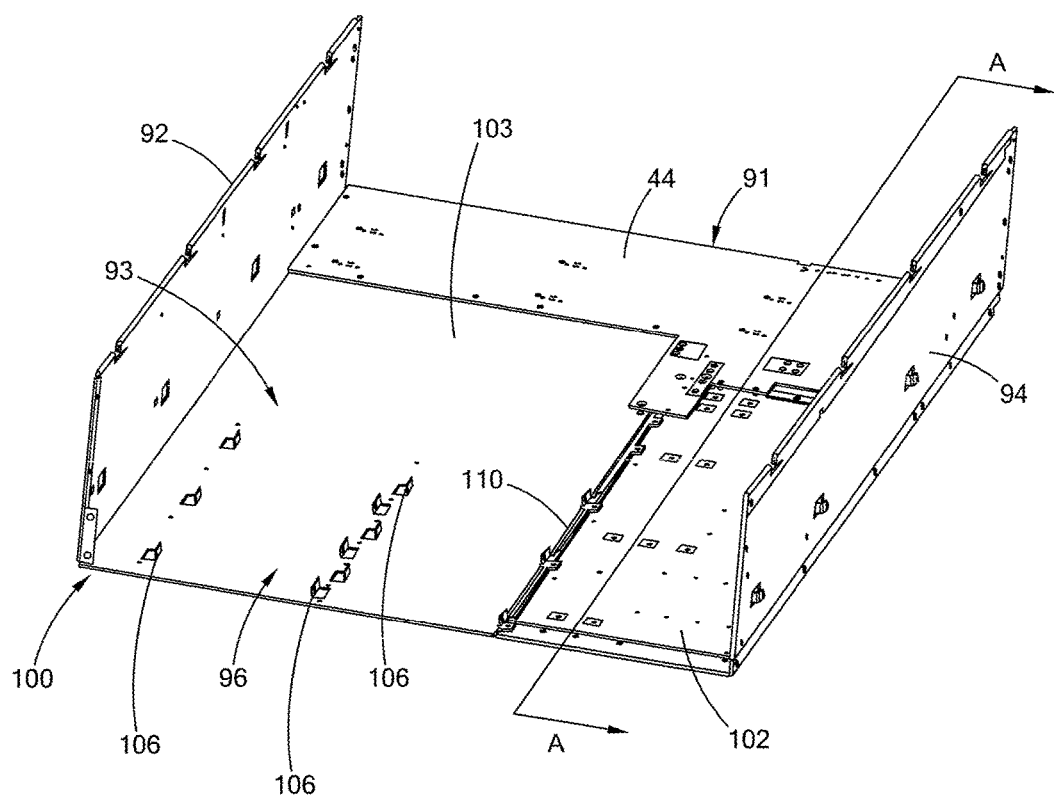
FIG. 10 is another perspective view of a cage of FIG. 8, showing a motherboard and a backplane assembled to the cage.

Referring to FIGS. 9 and 10, preferably, the main bottom plate 96 and the first side wall 92 are integrally formed to form a main frame portion 100. The motherboard 44 is disposed on the front portion 91 of the main bottom plate 96. A backplane 102 is connected to the main bottom plate 96 and disposed above the auxiliary bottom plate 98. The backplane 102 may be slightly raised from the main bottom plate 96. The main bottom plate 96 includes an L-shape flange 110 extending along the L-shape edge 95 of the main bottom plate 96. The L-shape flange 110 is slightly raised above the upper surface 103 of the main bottom plate 96 to properly position the backplane 102. The backplane 102 is clamped between the auxiliary bottom plate 98 and the L-shape flange 110. The auxiliary bottom plate 98 is provided underneath the backplane 102 and may be flush with the main bottom plate 96. An insulation layer (not shown) may be optionally provided between the backplane 102 and the auxiliary bottom plate 98. A plurality of standoffs 106 are formed on and may extend vertically and upwardly from the upper surface 103 of the main bottom plate 96. While not shown in FIGS. 9 and 10, it is understood that the standoffs 106 may also be formed in the front portion 91 of the main bottom plate 96 under the motherboard 44. It is also understood that the backplane 102 can be attached to the main bottom plate 96 by any conventional means, such as welding, gluing and fastening, without using the flange 110.

Figure 11:
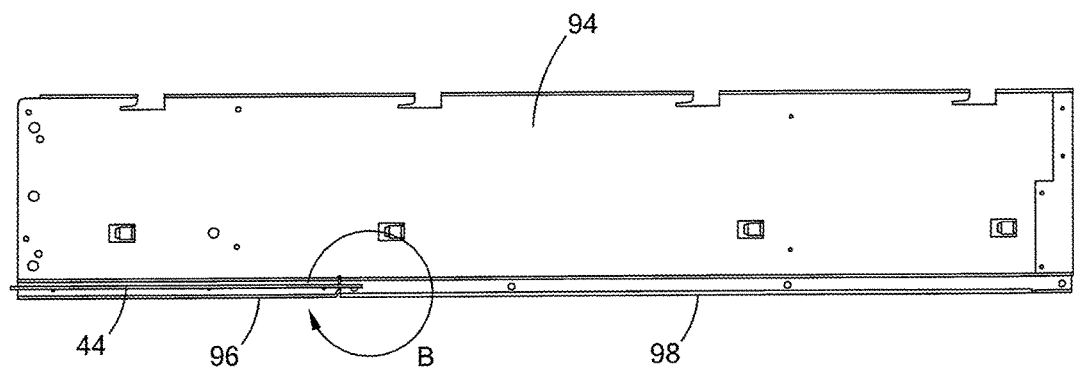
FIG. 11 is a cross-sectional view of a cage, taken along line A-A of FIG. 10.
Figure 12:
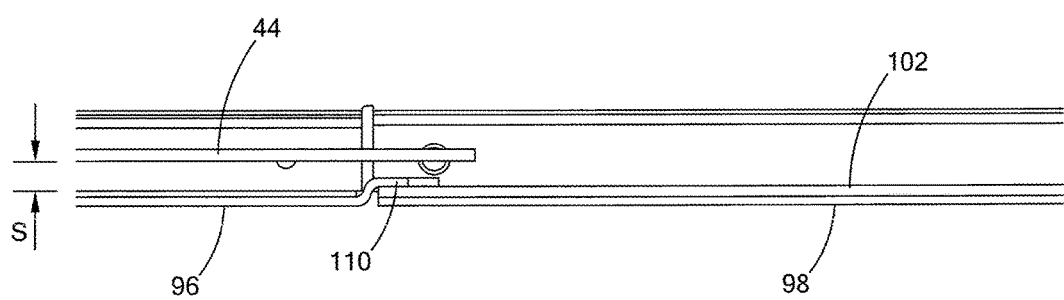
FIG. 12 is an enlarged view of portion B of FIG. 11.

Referring to FIGS. 11 and 12, the motherboard 44 may be provided above the standoffs 106 of the main bottom plate 96 to define a vertical space S between the motherboard 44 and the main bottom plate 96. The backplane 102 is provided on the auxiliary bottom plate 98 and is only slightly raised above the main bottom plate 96. Alternatively, the auxiliary bottom plate 98 can be eliminated and the flange 110 can be configured such that, when the backplane 102 is attached to the flange 110, the backplane 102 is flush with the main bottom plate 96 and is in substantially the same plane of the main bottom plate 96. A standoff may not be formed in the backplane 102. Therefore, the available vertical space for various electronic components above the backplane 102 is increased compared with the available space above the motherboard 44.

Figure 13:
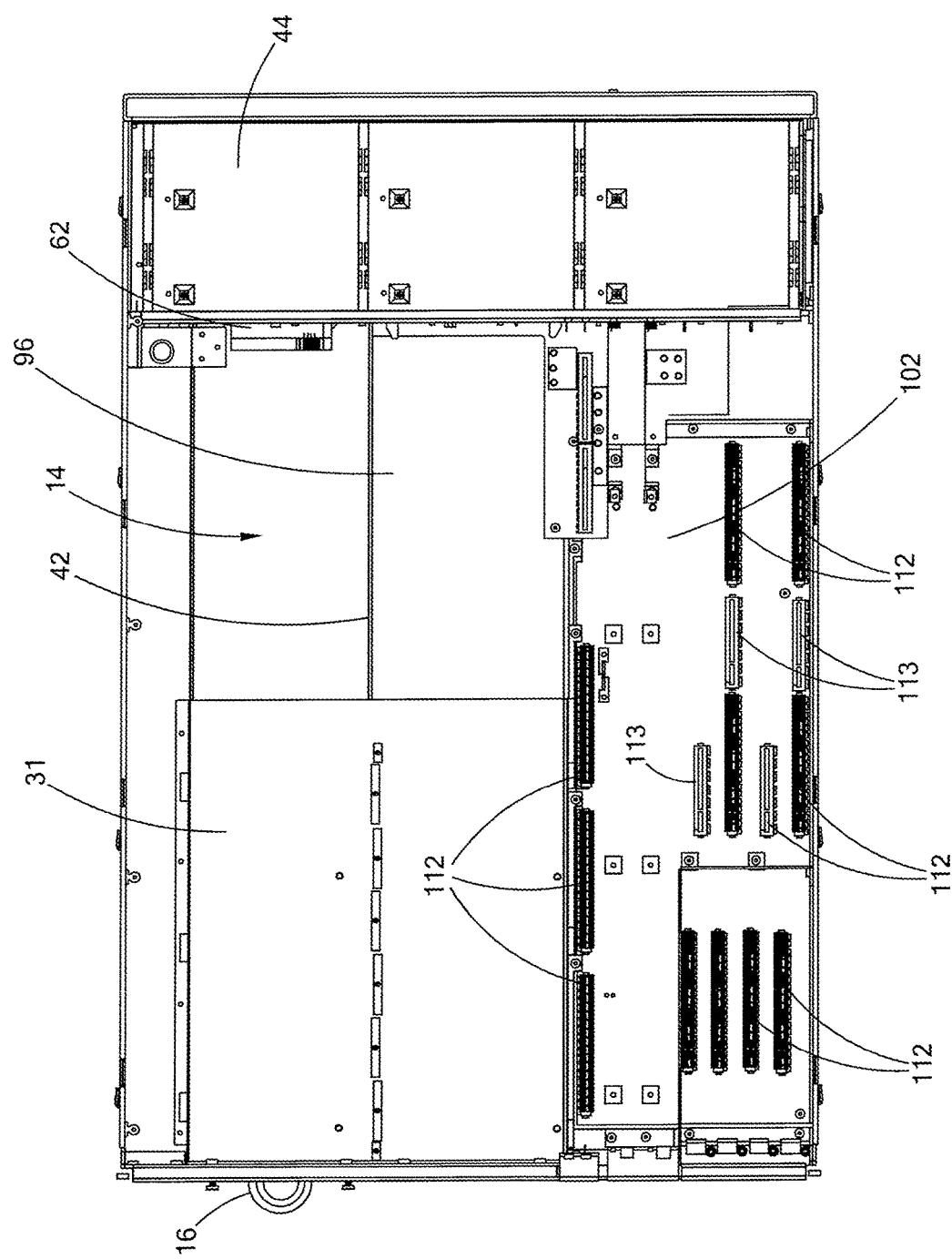
FIG. 13 is a top view of a cage of an electronic system, wherein one of the removable assemblies is installed in the cage.

Referring to FIG. 13, the backplane 102 may include circuit boards and electric connectors, such as card connectors. As an example, the electric connectors may include first peripheral component interconnect slots (PCI slots) 112 and second PCI slots 113 for receiving different types of circuit cards (not shown), such as network cards, memory cards, sound cards. Because the card connectors are formed on the backplane 102, which lies in the same plane of the first bottom plate 96 or which is only slightly raised above the first bottom plate 96, the available vertical space above the backplane 102 is increased. With the increased vertical space above the backplane 102, circuit cards of a relatively larger size can be installed in the cage 12 in a vertical orientation, as opposed to a typical cage where the available vertical space above the motherboard is limited due to the presence of standoffs between the bottom plate and the motherboard.

The main frame 100 of the present disclosure includes the main bottom plate 96 and the first side wall 92. A typical component for a typical cage may include a rectangular side plate and a rectangular bottom plate, which are integrally formed. The main frame 100 of the present disclosure can be formed by modifying the rectangular bottom plate into a main bottom plate 96 of a desired shape and then attaching a backplane 102 to the main bottom plate 96. The backplane 102 can be formed slightly above the main bottom plate 96 without standoffs in this area. The auxiliary bottom plate 98 can be optionally attached to and provided under the backplane 102 to protect the backplane 102. Alternatively, the backplane 102 can be formed flush with the main bottom plate 96 and the auxiliary bottom plate 98 can be eliminated to further increase the available vertical space above the backplane 102. Therefore, the bottom portion 90 of the cage 12 is formed by two pieces of plate components where standoffs are provided in only one of the plate components for supporting a motherboard thereon. Since no standoffs are formed in the other one of the plate components (the backplane 102), available vertical space above the backplane 102 is increased. Therefore, the expansion cards of a relatively larger size can be installed in a vertical orientation to increase packaging efficiency.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. An electronic system comprising:
   a cage for insertion into a data processing system, the cage containing electronic circuits and adapted to slidably receive a pair of removable assemblies so as to mate electrically with each of the removable assemblies through a respective cage connector;
   each removable assembly comprising:
      a connectorized power supply;
      a housing; and
      a circuit module including a power circuit mounted to the housing, having a first connector and a second connector,
      wherein the housing of the removable assembly is adapted to slidably receive the power supply so as to mate with the first connector; and, the second connector is sized and dimensioned to mate with the respective cage connector when the removable assembly is slidably inserted into the cage,
   wherein the power supply is removable from the housing of each removable assembly without removing the removable assembly from the cage; and, each removable assembly is removable from the cage, including the power supply, the circuit module and the housing.

2. The electronic system of claim 1, wherein the housing includes a top wall, a first side wall and a second side wall connected to the top wall, the housing defining a U shape cross section.

3. The electronic system of claim 2, wherein the circuit module includes a printed circuit board and plurality of circuit components.

4. The electronic system of claim 1, wherein the housing has a front end and a rear end, wherein the power supply is disposed adjacent to the rear end and the circuit module is disposed adjacent to the front end.

5. The electronic system of claim 1, wherein the cage includes a top-loading enclosure defining a top opening and a top cover removably mounted to the top-loading enclosure to cover the top opening.

6. The electronic system of claim 5, wherein the cage includes a second cover disposed between the top cover and the removable assemblies to cover at least a portion of the removable assembly.

7. The electronic system of claim 1, wherein the housing further comprises a handle.

* * * * *